(12) United States Patent
Yoshimoto

(10) Patent No.: US 6,177,752 B1
(45) Date of Patent: Jan. 23, 2001

(54) SURFACE ACOUSTIC WAVE DEVICE AND METHOD OF CONNECTING SURFACE ACOUSTIC WAVE FILTERS

(75) Inventor: Susumu Yoshimoto, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/471,933

(22) Filed: Dec. 23, 1999

(30) Foreign Application Priority Data

Dec. 25, 1998 (JP) .................................................. 10-371073

(51) Int. Cl.[7] .............................. H03H 11/32; H03H 9/64
(52) U.S. Cl. ........................................ 310/313 B; 333/195
(58) Field of Search ....................... 310/313 B; 333/193, 333/195

(56) References Cited

U.S. PATENT DOCUMENTS

| 5,581,141 | * | 12/1996 | Yamada et al. | .................. | 310/313 D |
| 5,932,950 | * | 8/1999 | Yamada et al. | .................. | 310/313 D |
| 5,999,068 | * | 12/1999 | Tsutsumi et al. | .................... | 333/193 |

FOREIGN PATENT DOCUMENTS

| 0 600 705 A1 | * | 6/1994 | (EP) | ..................................... | 333/195 |
| 6-85604 | | 3/1994 | (JP) | ................................. | H03H/9/64 |
| 6-48233 | | 6/1994 | (JP) | ................................. | H03H/9/64 |
| 8-237064 | | 9/1996 | (JP) | ............................. | H03H/9/145 |
| 10-107583 | | 4/1998 | (JP) | ................................. | H03H/9/64 |
| 10-190404 | | 7/1998 | (JP) | ................................. | H03H/9/25 |

* cited by examiner

*Primary Examiner*—Thomas M. Dougherty
(74) *Attorney, Agent, or Firm*—McGinn & Gibb, PLLC (57) ABSTRACT

A surface acoustic wave device and method of connecting surface acoustic wave filters are provided in which the relative out-of-band attenuation is increased to prevent the propagation of electrical feedthrough from the input of a first stage to the output of the second stage of a device. In a multistage connection configuration of transversely coupled mode resonator-type surface acoustic wave (SAW) filters, electrically balanced signals are applied to the two inputs of the first-stage filter, the portion between stages that joins the first-stage filter and the second-stage filter is an electrically unbalanced connection, and one of the connections between the two outputs of the first stage and the two inputs of the second stage is connected to ground potential. Subsequently, the two outputs of the second stage again become electrically balanced signal output.

20 Claims, 10 Drawing Sheets

SURFACE ACOUSTIC WAVE DEVICE AND METHOD OF CONNECTING SURFACE ACOUSTIC WAVE FILTERS

BACKGROUND OF THE INVENTION

1. Field of the Invention:

The present invention relates to a multi-stage connected surface acoustic wave device and a method of connecting surface acoustic wave filters.

2. Description of the Related Art:

According to methods of connecting balanced-connection transversely coupled mode resonator-type SAW filters of the prior art, a plurality of surface acoustic wave (SAW) filters were cascade-connected in a balanced-connection mode, each stage being connected in an electrically balanced state.

In the above-described prior art, however, unwanted electromagnetic coupling occurs between the input and output ports of a device. This electromagnetic coupling raises problems because it causes deterioration in out-of-band attenuation, and therefore improvements have been sought.

Figure 1:
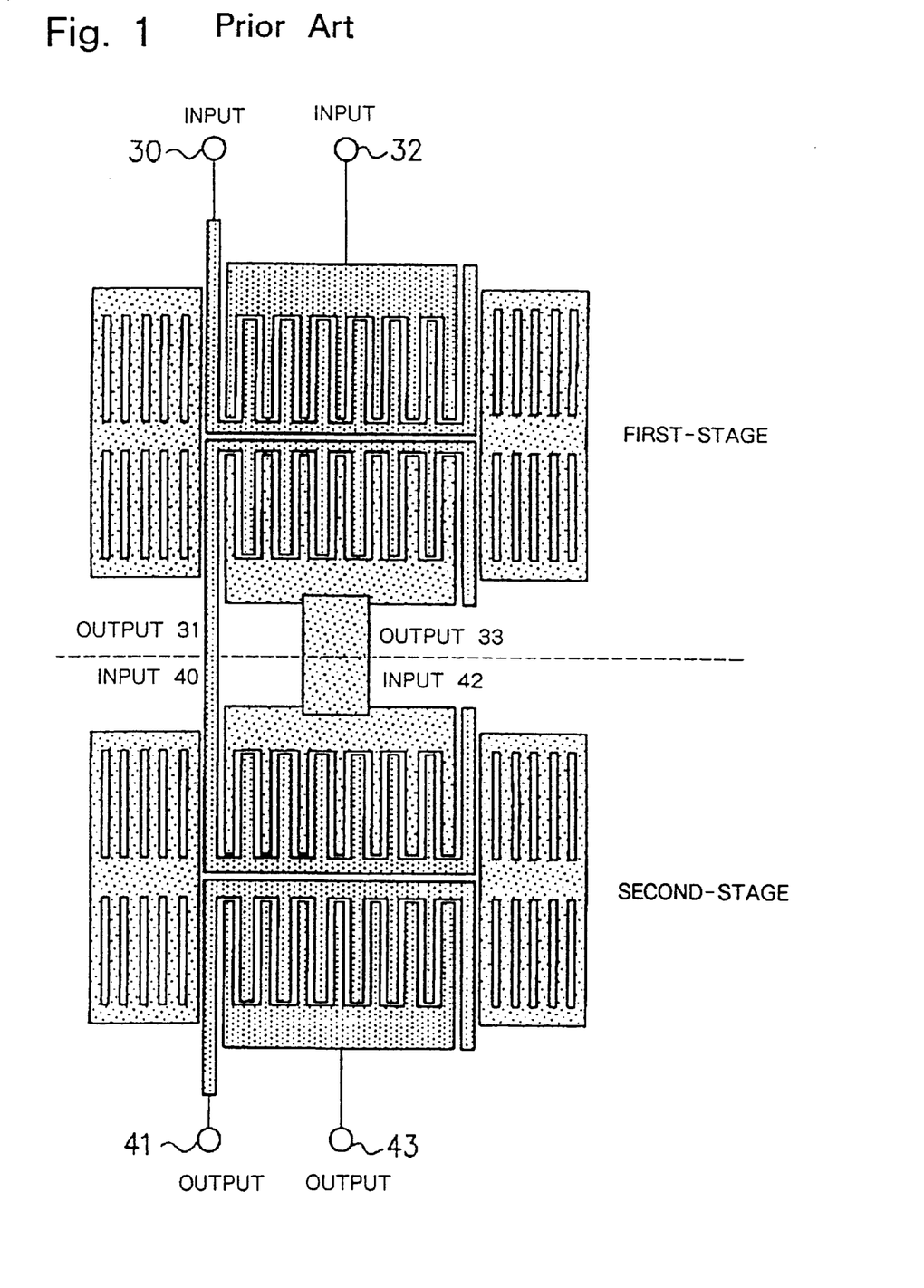
Figure 2:
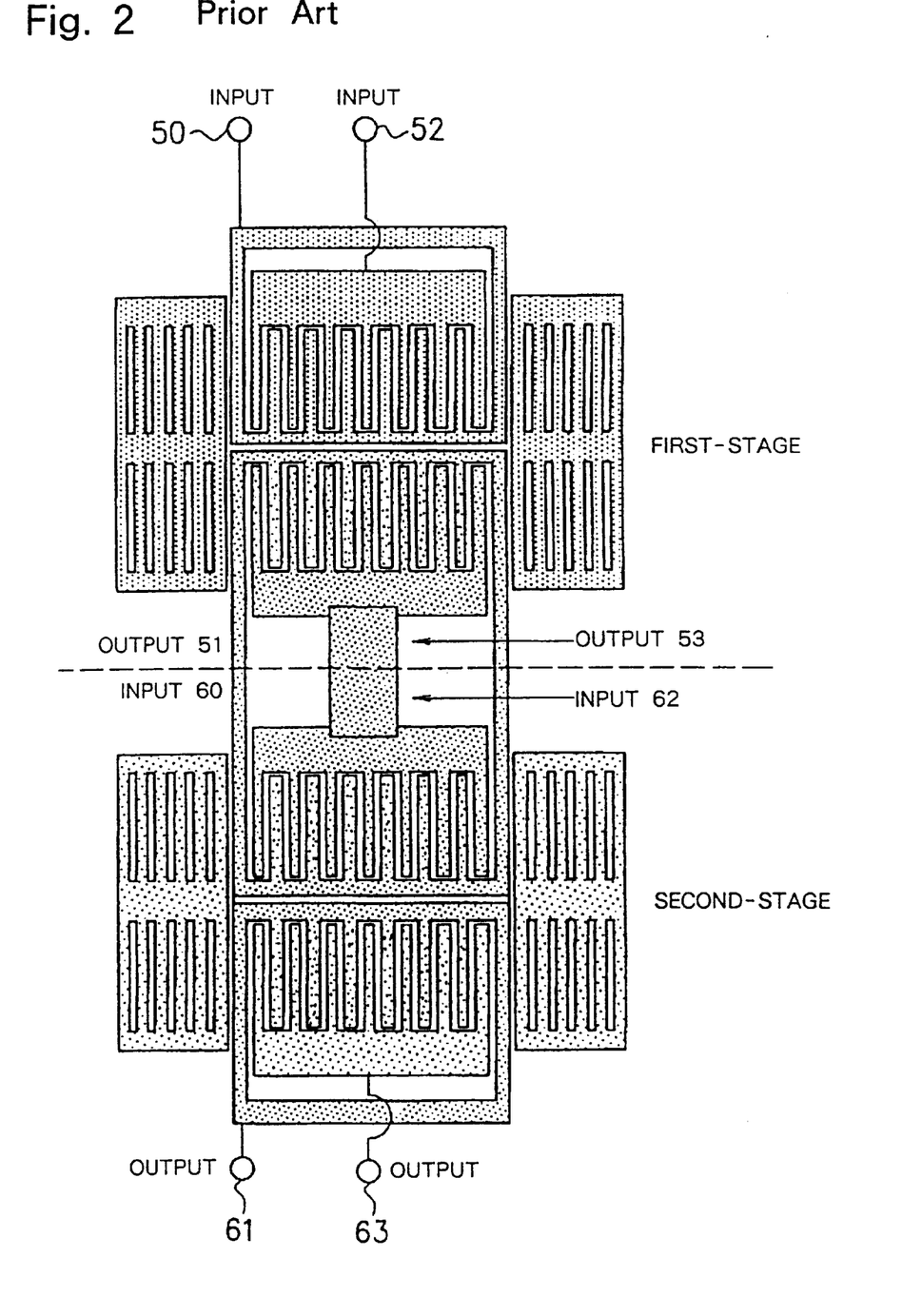
FIG. 2 is a schematic plan view showing the second example of the structure of a surface acoustic wave device having a structure of the prior art.

Examples of the construction of surface acoustic wave filters of the prior art are shown in FIG. 1 and FIG. 2. In these examples, first-stage output 31 and second-stage input 40, as well as first-stage output 33 and second-stage input 42, are connected in an electrically balanced state and are not connected to a ground, and as a result, adequate out-of-band attenuation could not be obtained. A more detailed explanation follows.

Figure 3:
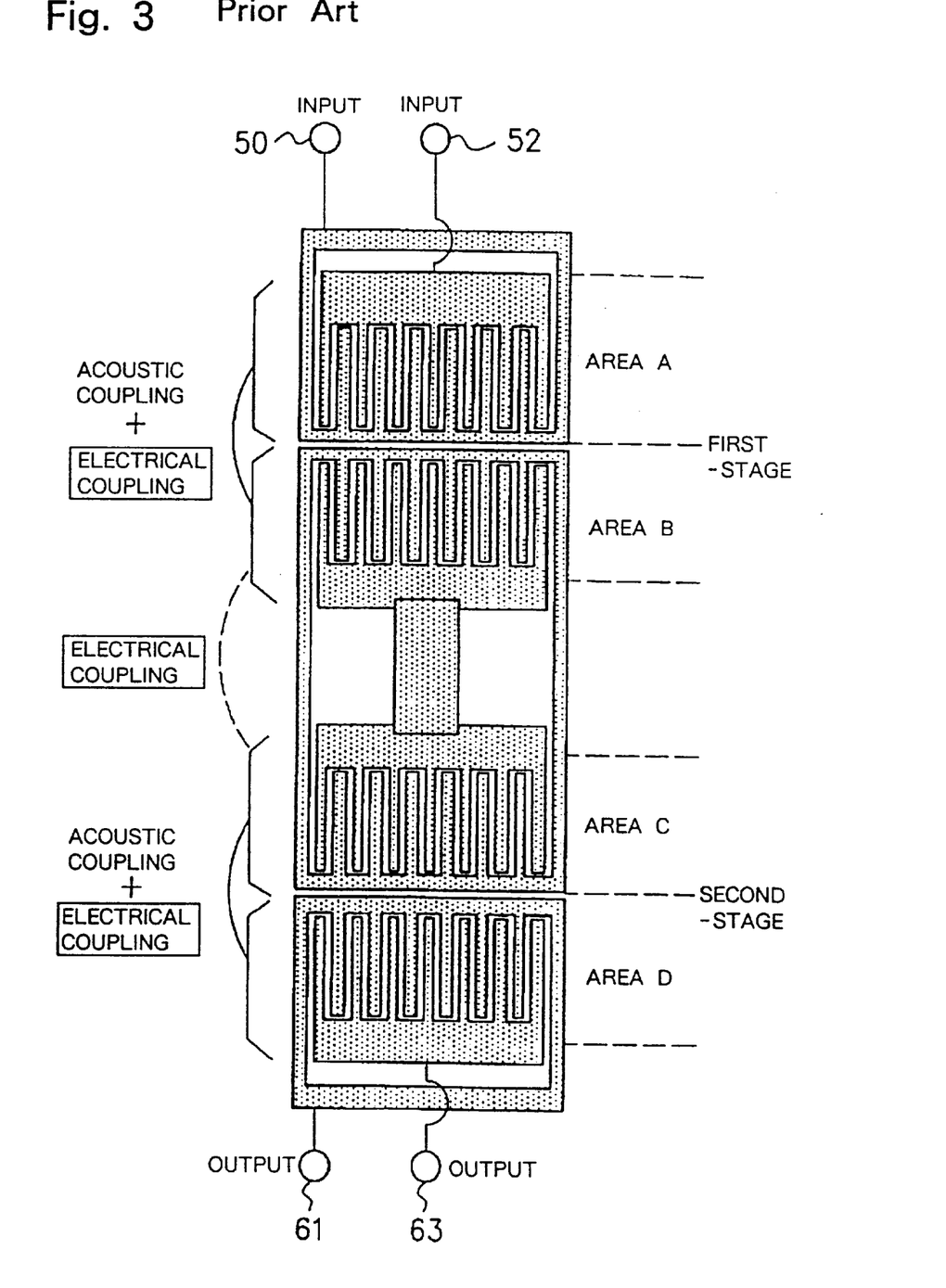
FIG. 3 is a schematic plan view illustrating the operation of the surface acoustic wave device having the structure of the prior art examples.
Figure 4:
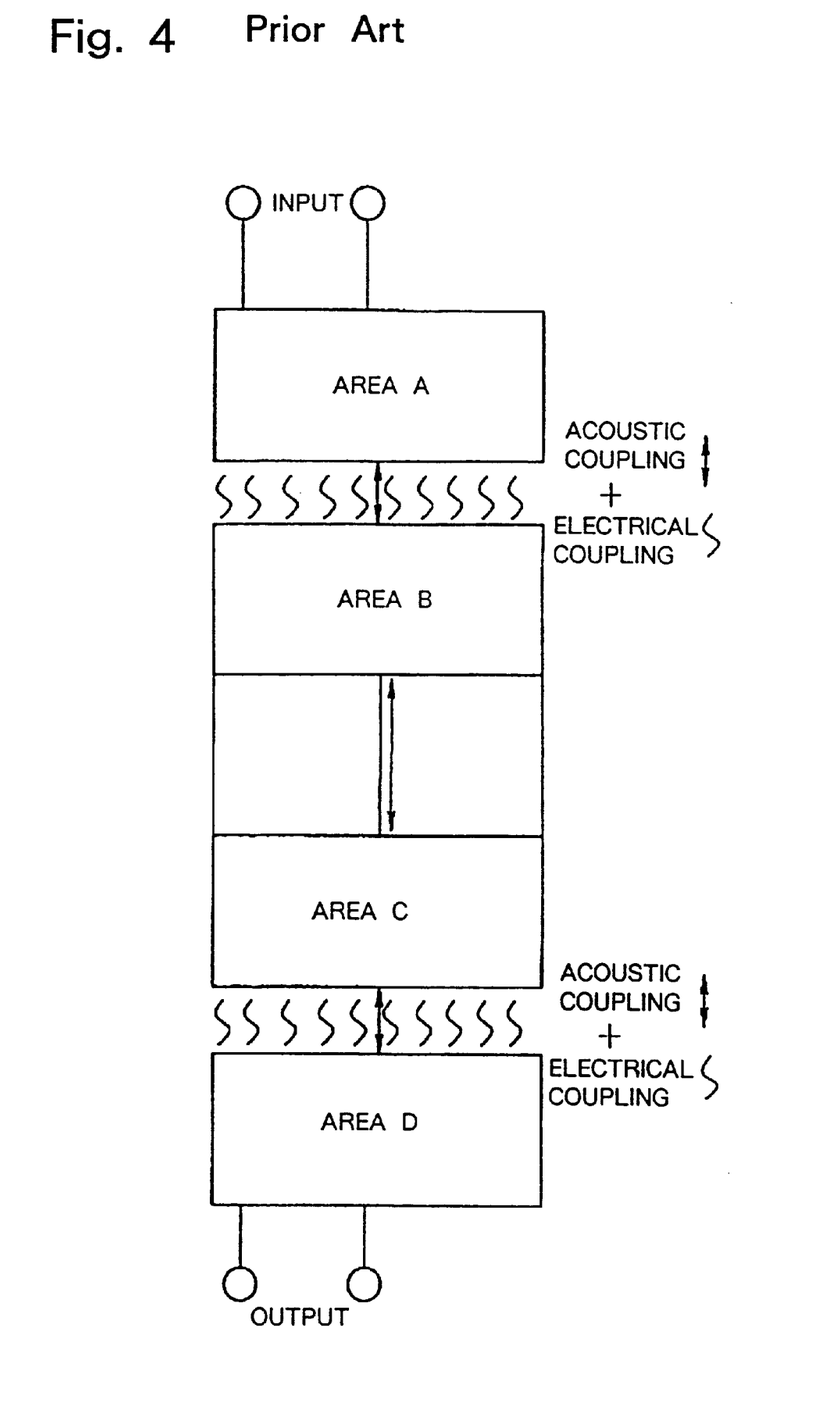
FIG. 4 is a schematic view of FIG. 3.

FIG. 3 is a schematic plan view illustrating the structure of a transversely coupled mode resonator-type SAW filter according to the electrically balanced connection method of the prior art. FIG. 4 is a schematic view illustrating the characteristics of the transversely coupled mode resonator-type cascade-connected SAW filter shown in FIG. 3.

Referring now to FIG. 3 and FIG. 4, in a transversely coupled mode resonator-type cascade-connected SAW filter of the prior art having a balanced input/output port structure, the perimeters of area B and area C are enclosed by a signal line, but the electric potential of these areas is not the ground potential. As a result, unwanted electromagnetic radiation emitted from first-stage area A destabilizes the potential of the signal line of area B, and unwanted electromagnetic coupling from area A to area B tends to occur.

Signals due to this unwanted electromagnetic coupling are transmitted from area B to area C, and the transfer of the above-described unwanted electromagnetic radiation then occurs from area C to area D. As a consequence, a route of unwanted electrical coupling is created that passes directly from input to output. Generally, signals due to this unwanted electromagnetic coupling are not dependent on the parameters that determine the structure of Interdigital Transducers (IDT) of the SAW device. As a result, these signals become feedthrough signals between the input and output electrical ports, and these signals cause deterioration in the out-of-band attenuation and generate in-band ripple.

Figure 5:
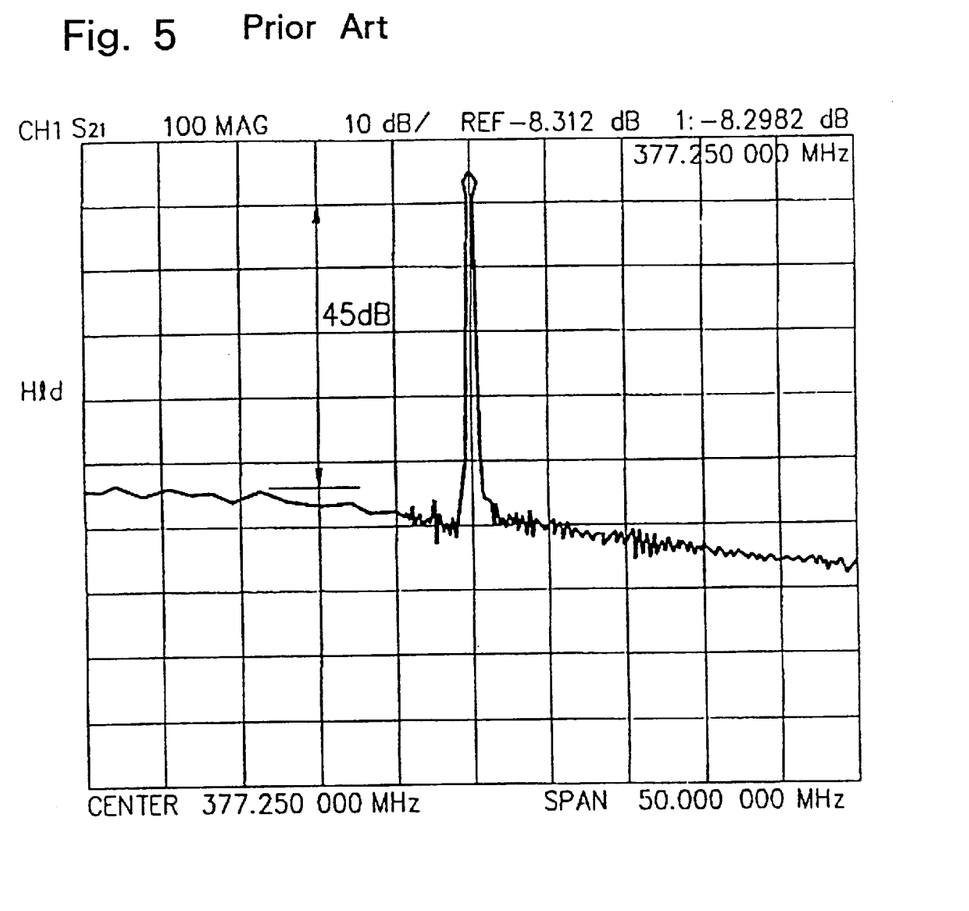
FIG. 5 is a graph of the pass characteristics of a surface acoustic wave filter in which the prior art is applied.

FIG. 5 is a graph showing the pass characteristics of SAW filter in which the prior art is applied. In FIG. 5, taking a resonance peak in the vicinity of 377.25 MHz as a reference, a relative out-of-band attenuation of no more than approximately 45 dB was obtainable.

SUMMARY OF THE INVENTION

It is an object of the present invention to provide a surface acoustic wave device that increases the relative out-of-band attenuation, as well as a method of connecting surface acoustic wave filters.

The surface acoustic wave device of the present invention has two or more stages of surface acoustic wave filters in cascade connection with at least one of the connection lines of input and output signals that connect the stages of surface acoustic wave filters being connected to ground potential to produce an electrically unbalanced connection.

In addition, the above-described surface acoustic wave filters may be filters having interdigital transducers formed on a piezoelectric substrate.

Further, the surface acoustic wave filters should be transversely coupled mode resonator-type filters that transfer energy in a mode that distributes perpendicularly to the direction the propagation of surface waves.

The surface acoustic wave filter connection method of the present invention is for a case in which surface acoustic wave filters are in a cascade connection of two or more stages, at least one of the connection lines that join input and output signals in the stages of the surface acoustic wave filters being connected to ground potential to produce an electrically unbalanced connection.

Finally, the above-described surface acoustic wave filters may be filters having interdigital transducers, and may be connected on a piezoelectric substrate.

The above and other objects, features, and advantages of the present invention will be better understood from the following description based on the accompanying drawings which illustrate examples of preferred embodiments of the present invention.

BRIEF DESCRIPTION OF THE DRAWINGS (FIG. 1 is a schematic plan view showing the first example of the structure of a surface acoustic wave device having a structure of the prior art.

DETAILED DESCRIPTION OF THE PREFERRED EMBODIMENTS

Referring to the figures, the best mode of the first embodiment of the surface acoustic wave device and surface acoustic wave filter connection method of the present invention are next explained in detail.

Figure 6:
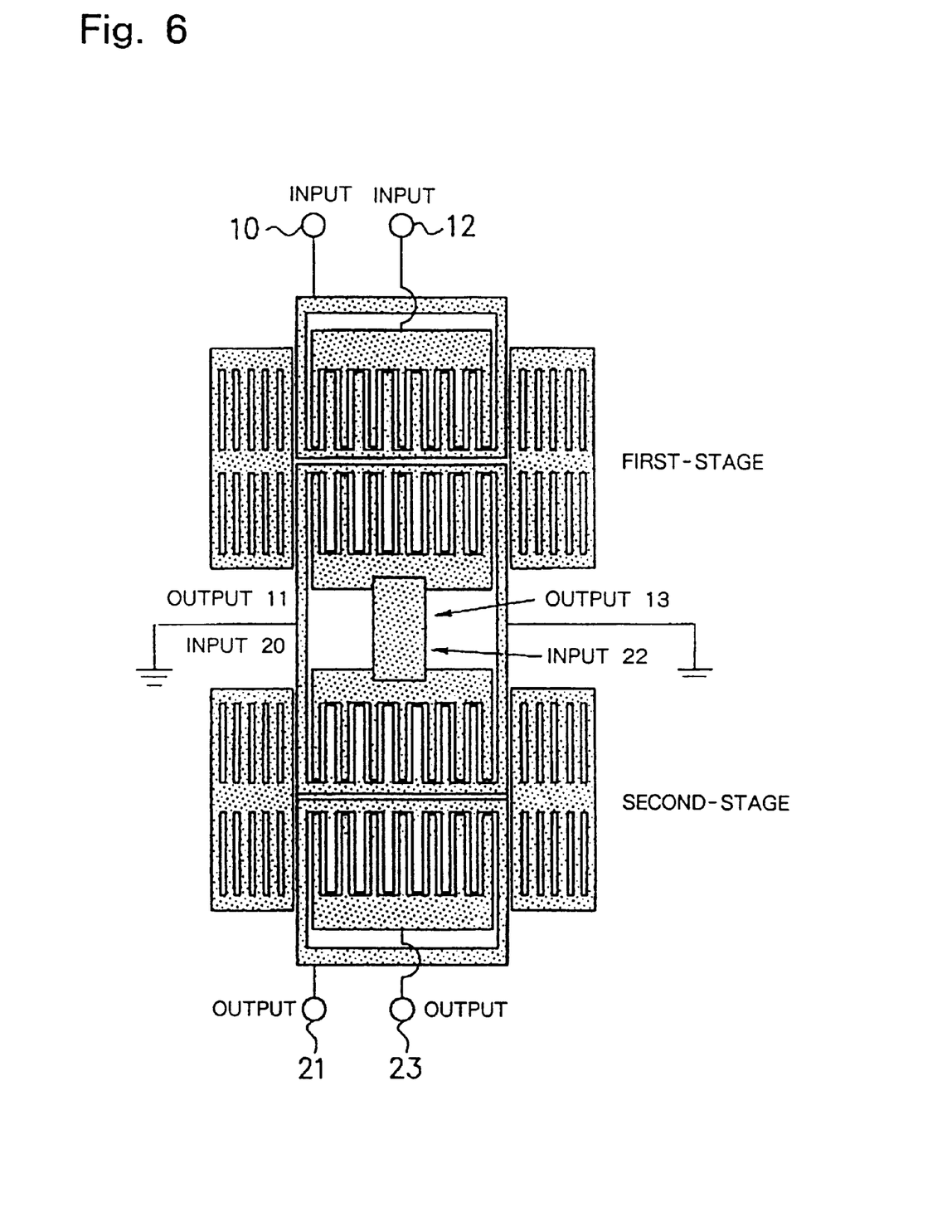
FIG. 6 is a schematic plan view showing the best mode of the first embodiment of the surface acoustic wave device of the present invention.

FIG. 6 shows an example of the structure of a transversely coupled mode resonator-type surface acoustic wave (SAW)

filter according to the preferred mode of the first embodiment of the present invention. As described above, input 10 and input 12 are electrically balanced signal inputs, the portion between stages that joins the first-stage filter and second-stage filter is an electrically unbalanced connection, and the line between first-stage output 11 and second-stage input 20 is connected to the ground potential. In addition, output 21 and output 23 from the second stage are again electrically balanced signal outputs.

Figure 7:
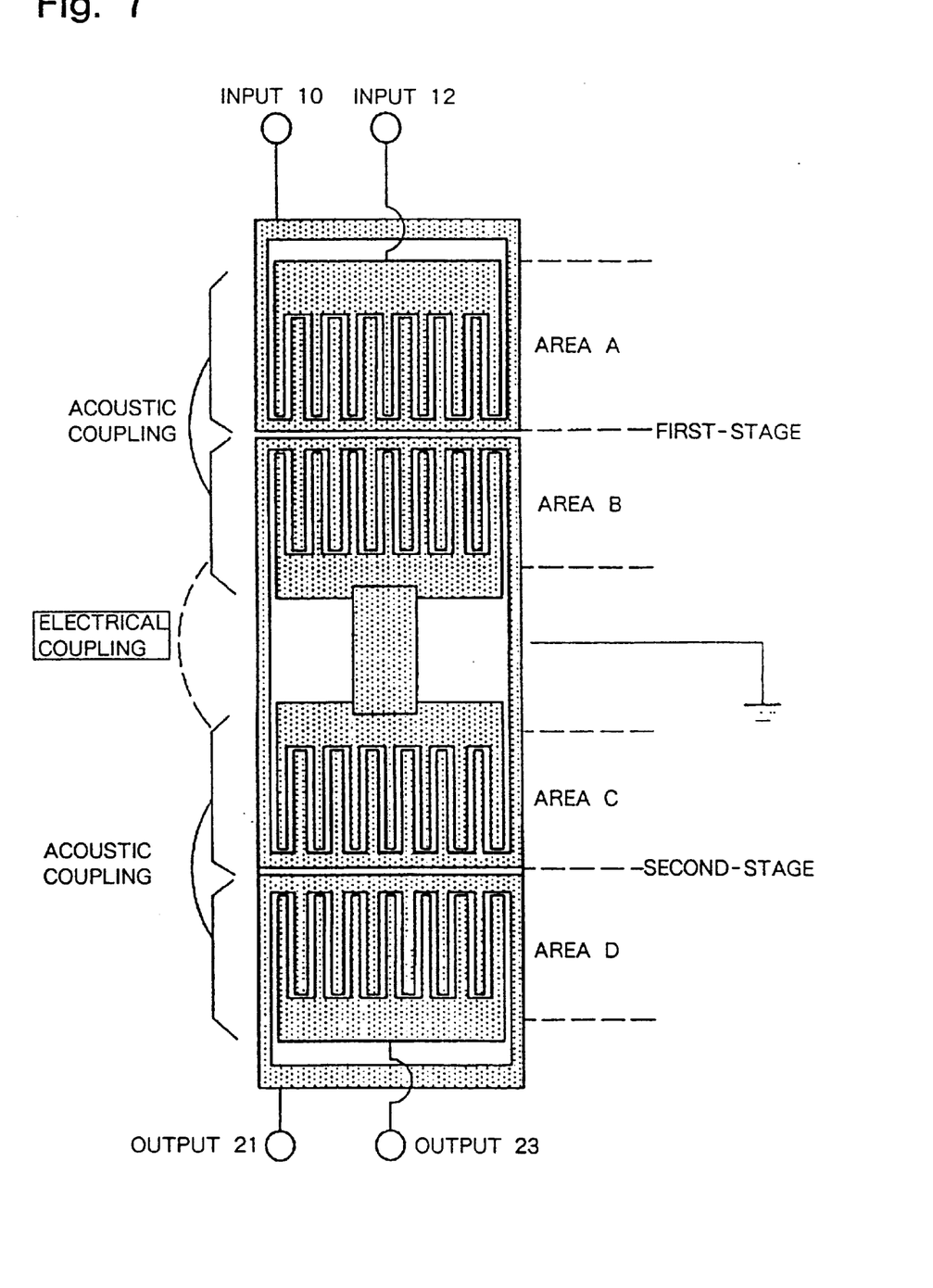
FIG. 7 is a schematic plan view for explaining the principles of operation of the device of FIG. 6.
Figure 8:
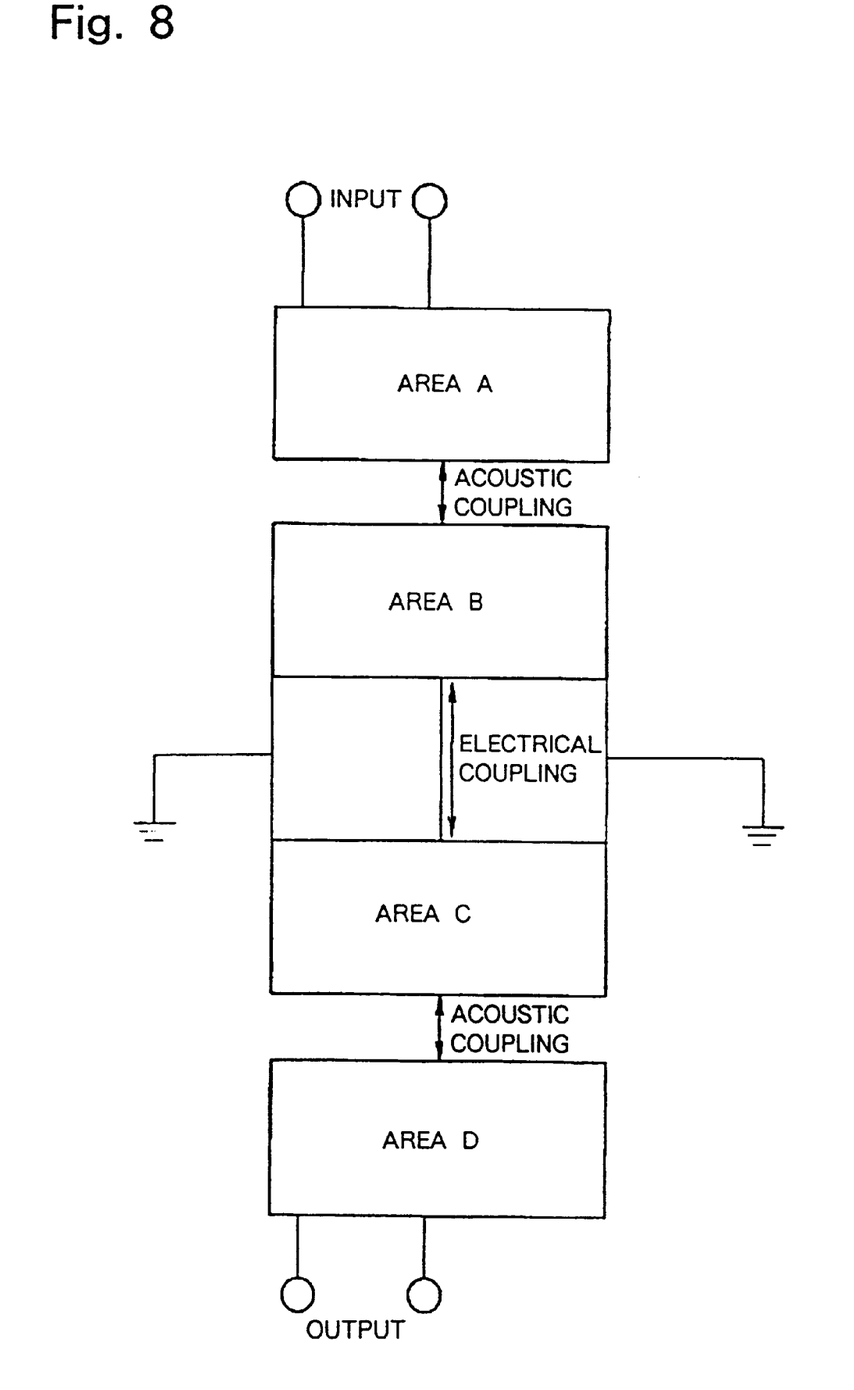
FIG. 8 is a schematic view of FIG. 7.

The operation of this embodiment is next explained in detail using FIG. 6 to FIG. 9. In FIG. 6, a transversely coupled mode resonator-type surface acoustic wave filter is shown which has electrically balanced output and input ports of the present invention. FIG. 7 is a schematic view illustrating the principles of operation of the device of FIG. 6, the grating reflector of FIG. 6 being omitted. As shown in FIG. 7, the formation area of interdigital transducers is divided into the four areas A, B, C, and D, from the top down, and energy that enters from the input port is propagated in the order of area A to area B, from area B to area C, and from area C to area D. The energy transfer mode between each of these four areas differs according to the inter-port connection method. Ideally, the energy transfer from area A to area B is by acoustic coupling, from area B to area C by electrical coupling, and from area C to area D by acoustic coupling. FIG. 8 shows a more schematic view of the state of this energy transfer.

As can be understood from FIG. 7 and FIG. 8, one of the electrically balanced signal lines that connects area B and area C is connected to ground potential, and the perimeter of area B and area C is surrounded by a signal line that is connected to ground potential. As a result, the two areas, area B and area C, are electrically shielded from unwanted outside electromagnetic radiation by the signal line of ground potential that surrounds their perimeters. In this construction, therefore, energy transfer from area A to area B, or from area C to area D, is only acoustic without any incidence of unwanted electrical coupling, and as a result, unwanted electrical coupling does not occur across all areas.

Figure 9:
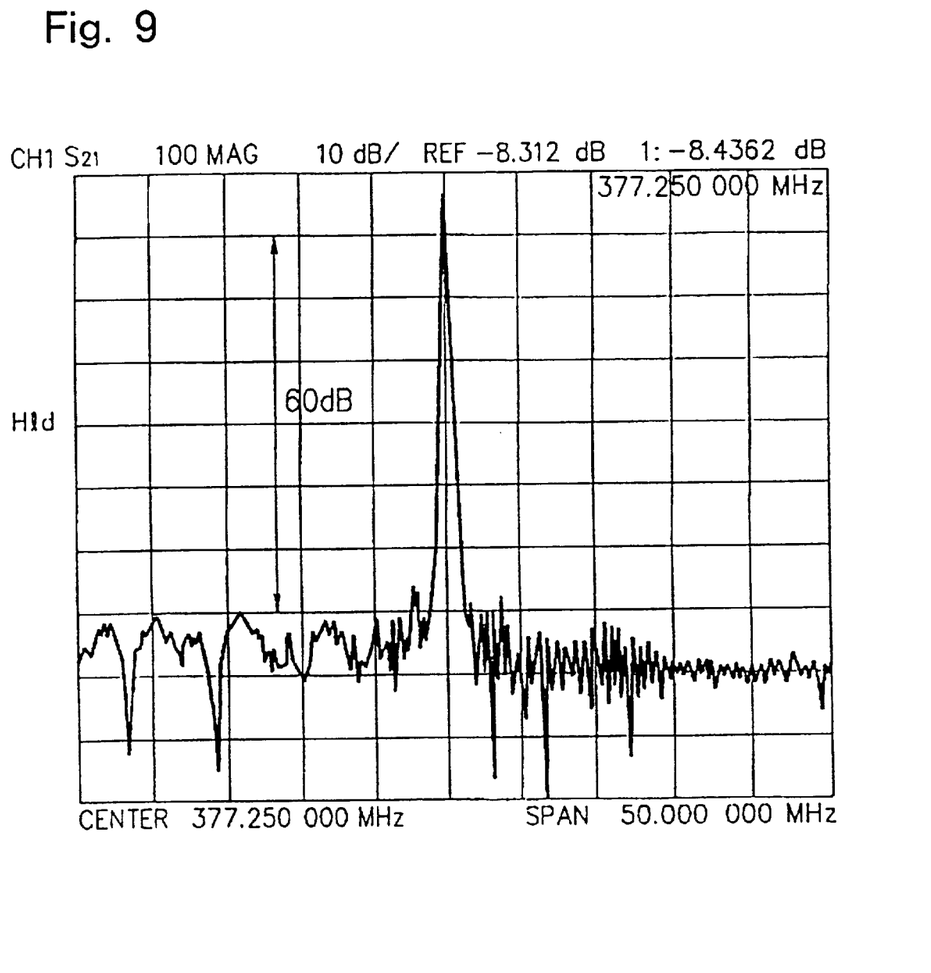
FIG. 9 is a graph of the pass characteristics of the surface acoustic wave filter in which the present invention is applied.

FIG. 9 is a graph of the pass characteristics of a surface acoustic wave filter of this invention. In FIG. 5, which is a graph of the pass characteristics for the case of a surface acoustic wave filter of the prior art, a relative out-of-band attenuation of no more than approximately 45 dB could be obtained with a resonance peak in the vicinity of 377.25 MHz taken as a reference. In contrast, it can be seen from FIG. 9 of the surface acoustic wave filter of the present invention that the relative out-of-band attenuation becomes approximately 60 dB, for an improvement in out-of-band attenuation of approximately 15 dB over the prior-art surface acoustic wave filter.

In the preferred mode of this embodiment of the present invention, a transversely coupled mode resonator-type filter is shown that carries out energy transfer via a mode of distribution in a direction perpendicular to the direction in which surface acoustic waves are propagated (hereinbelow referred to as a "transversely coupled mode") even in a surface acoustic wave device having interdigital transducers constructed on a piezoelectric substrate. A device configuration for improving the out-of-band attenuation is thus obtained in a multiple-stage filter in which a plurality of transversely coupled mode resonator-type surface acoustic wave filters in cascade connection and having electrically balanced input and output electrical ports.

FIG. 6 shows an example of the construction of the above-described filter. When a balanced alternating voltage is applied to input 10 and input 12, surface acoustic waves are driven from the first upper interdigital transducer (hereinbelow abbreviated as "IDT").

The driven surface acoustic waves are propagated in a left-right direction in the figure, and at this time, an acoustic transversely coupled mode potential distribution is enabled that has a spread in the direction perpendicular to the direction of propagation of the surface acoustic waves. As a result, signals are received as the transversely coupled mode potential by the first lower IDT, converted again to electrical signals, and output to output ports 11 and 13. The frequency band that allows efficient energy conversion from electrical signals to acoustic signals and back to electrical signals depends on such factors as the pitch of the IDT, the spacing between the upper IDT and lower IDT, the aperture length of the IDT, and the thickness of the transducers electrodes that form the IDT. The desired filter characteristics can be realized by appropriately setting these design parameters.

The feature of this embodiment is that, in a case in which two or more stages of the above-described balanced-connection transversely coupled mode resonator-type filters are cascade-connected, an electrically unbalanced connection between stages is realized by connecting the electrical signal line that joins output 11 and input 20 to the ground potential instead of adopting the electrically balanced connection for each connection between stages as in the prior art. Adoption of this connection structure allows prevention of propagation of electrical feedthrough from inputs 10 and 12 to output 21 and output 23, and as a result, can improve out-of-band attenuation in the filter characteristics.

Figure 10:
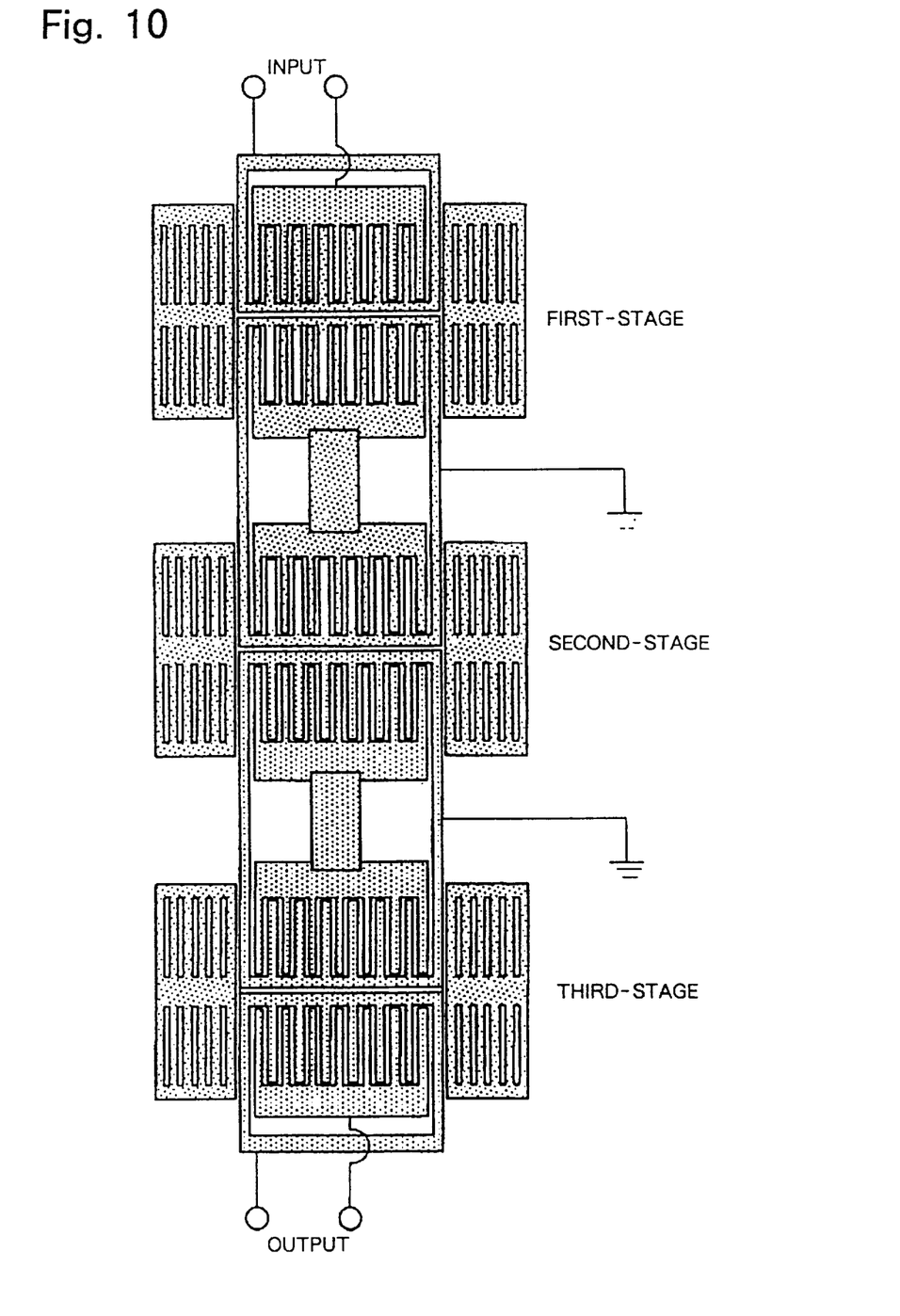
FIG. 10 shows the structure of the best mode of the second embodiment of the surface acoustic wave device of the present invention.

Referring now to FIG. 10, the preferred mode of the second embodiment of the present invention is next described. In the preferred mode of the second embodiment, balanced-connection transversely coupled mode resonator-type surface acoustic wave filters are cascade-connected in three stages. A three-stage connection is shown in FIG. 10, but the same effect as in the preferred mode of the first embodiment can be obtained in a case in which a plurality of surface acoustic wave filters are in cascade connection by connecting at least one of the connection lines of input and output signals between stages to the ground potential.

As is clear from the foregoing explanation, at least one of the connection lines of the input and output signals between the stages of surface acoustic wave filters in the surface acoustic wave device of the present invention is connected to ground potential. This configuration allows prevention of the propagation of electrical feedthrough from the input to the output of a device, thereby enabling an improvement in the filter characteristics in attenuation outside the pass band, i.e., the blocked region, of the filter.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A surface acoustic wave device in which two or more stages of surface acoustic wave filters are in a cascade connection, wherein:
   at least one of the connection lines of input and output signals that join the stages of said surface acoustic wave filters is connected to ground potential; and
   the input and output ports that join the stages of said surface acoustic wave filters have an electrically unbalanced connection,
   wherein a perimeter of an output portion of a first stage and an adjacent input portion of a second stage are substantially surrounded by a signal line connected to ground potential, wherein input ports that are connected to an external electrical source have an electrically balanced connection, and wherein output ports connected to an external electrical load have an electrically balanced connection.

2. The surface acoustic wave device according to claim 1, wherein said surface acoustic wave filter is formed on a piezoelectric substrate.

3. The surface acoustic wave device according to claim 1, wherein said surface acoustic wave filter comprises a filter having interdigital transducers.

4. The surface acoustic wave device according to claim 2, wherein said surface acoustic wave filter comprises a filter having interdigital transducers.

5. The surface acoustic wave device according to claim 1, wherein said surface acoustic wave filters are transversely coupled mode filters that effect energy transfer by a mode of distribution in a direction perpendicular to the direction of surface wave propagation.

6. The surface acoustic wave device according to claim 2, wherein said surface acoustic wave filters are transversely coupled mode filters that effect energy transfer by a mode of distribution in a direction perpendicular to the direction of surface wave propagation.

7. The surface acoustic wave device according to claim 3, wherein said surface acoustic wave filters are transversely coupled mode filters that effect energy transfer by a mode of distribution in a direction perpendicular to the direction of surface wave propagation.

8. The surface acoustic wave device according to claim 5, wherein said surface acoustic wave filters comprise filters having interdigital transducers, and wherein said filters are located proximally on a piezoelectric substrate.

9. The surface acoustic wave device according to claim 7, wherein said interdigital transducers are formed on at least a first area, a second area, a third area, and a fourth area of said surface acoustic wave filter.

10. The surface acoustic wave device, according to claim 9, wherein a side of said first area is adjacent and connected to an input port, a side of said second area being adjacent to a side of said first area opposite said side connected to an input port, a side of said third area being adjacent to a side of said second area opposite said side of said second area adjacent to said first side, and a fourth area having a side adjacent said a side of a third area opposite said side of said third area adjacent said second area, and a side of said fourth area opposite said side adjacent said third area being connected to an output port.

11. The surface acoustic wave device according to claim 9, wherein said energy transfer from said first area to said second area and from said third area to said fourth area is by acoustic coupling, without electrical coupling.

12. The surface acoustic wave device according to claim 9, wherein said energy transfer from said second area to said third area is by electrical coupling.

13. The surface acoustic wave device according to claim 9, wherein said second area and said third area are electrically shielded from electromagnetic radiation.

14. The surface acoustic wave device according to claim 13, wherein said second area and said third area are substantially surrounded by said signal line connected to ground potential.

15. The surface acoustic wave device according to claim 9, wherein electrical coupling does not occur across all of said first through fourth areas.

16. A method of connecting surface acoustic wave filters in which two or more stages of surface acoustic wave filters are in a cascade connection;

wherein at least one of connection lines that connect input and output signals of each stage of said surface acoustic wave filters is connected to ground potential; and the input and output signals of each stage of said surface acoustic wave filters are in an electrically unbalanced connection, wherein a perimeter of an output portion of a stage and an adjacent input portion of a stage are substantially surrounded by a signal line connected to ground potential, wherein input ports that are connected to an external electrical source have an electrically balanced connection, and wherein output ports connected to an external electrical load have an electrically balanced connection.

17. A surface acoustic wave device, comprising:

a first stage of surface acoustic wave filters; and a second stage of surface acoustic wave filters in a cascade connection with said first stage, wherein said cascade connection comprises connection lines of input and output signals for joining said stages, wherein at least one of the connection lines of input and output signals that join the stages of said surface acoustic wave filters is connected to ground potential, wherein the input and output ports that join the stages of said surface acoustic wave filters have an electrically unbalanced connection, and wherein a perimeter of an output portion of a first stage and an adjacent input portion of a second stage are substantially surrounded by a signal line connected to ground potential.

18. The surface acoustic wave device, according to claim 17, wherein said surface acoustic wave device comprises stages in addition to said first and second stage of surface acoustic filters.

19. The surface acoustic wave device, according to claim 17, wherein input ports connected to an external electrical source have an electrically balanced connection.

20. The surface acoustic wave device, according to claim 17, wherein output ports connected to an external electrical load have an electrically balanced connection.

* * * * *